United States Patent [19]
Thompson et al.

[11] Patent Number: 5,057,791

[45] Date of Patent: Oct. 15, 1991

[54] DEVICE AND METHOD FOR BI-DIRECTIONAL AMPLIFICATION WITH A JFET

[75] Inventors: Mark W. Thompson, Fairport; Donald R. Martz, Webster; George D. Helm, Fairport, all of N.Y.

[73] Assignee: Harris Corporation, Rochester, N.Y.

[21] Appl. No.: 515,450

[22] Filed: Apr. 27, 1990

[51] Int. Cl.$^5$ .............................................. H03F 3/16
[52] U.S. Cl. ...................................... 330/277; 455/84
[58] Field of Search ................. 330/51, 107, 277, 300, 330/302, 305, 306; 455/78, 84

[56] References Cited

U.S. PATENT DOCUMENTS 3,519,765  7/1970  Huber ..................................... 455/84
4,590,437  5/1986  Butler et al. ......................... 330/277

OTHER PUBLICATIONS

Schilling, Donald L. and Belove, Charles, *Electronic Circuits: Discrete and Integrated*, McGraw-Hill 1979 pp. 145-146.

Primary Examiner—Steven Mottola
Attorney, Agent, or Firm—Rogers & Killeen

[57] ABSTRACT

A bi-directional amplifier having two symmetrical and versatile impedance matching circuits with a JFET therebetween, and a method for bi-directional amplification using a JFET. Each junction of the JFET may be a drain or a source depending on the direction of amplification. Each impedance matching circuit provides a low impedance for the junction that is a source and a high impedance for the junction that is a drain. The impedance is varied by adding a first capacitor parallel to a resonating inductor and a second capacitor, which is removed or inserted in series with the load, responsive to the direction of amplification. The frequency of the signal being amplified may be different for each direction.

15 Claims, 2 Drawing Sheets

DEVICE AND METHOD FOR BI-DIRECTIONAL AMPLIFICATION WITH A JFET

BACKGROUND OF THE INVENTION

The present invention relates to bi-directional amplifiers, and more particularly to bi-directional amplifiers using junction field effect transistors (JFET).

Amplifiers are commonly found in numerous types of electronic equipment. They are, for example, basic building blocks in receiver and transmitter design. In certain applications, it has been found desirable to reduce the number of electronic components by providing amplifier systems which are bi-directional, that is, they amplify a signal flowing in either direction through the amplifier system. Bi-directional amplifier systems are known, for example, in voice frequency amplification, closed circuit television video and control signal amplifiers and in digital data amplifiers. Such devices typically have separate amplification means for each direction of signal travel and share some of the non-amplifier reversible components, such as filters and mixers. Accordingly, such devices do not reduce the number of amplifiers but do provide more convenient packaging. (See, U.S. Pat. No. 3,889,072 to Stewart, U.S. Pat. No. 4,714,959 to Pshtissky and U.S. Pat. No. 3,882,274 to Vice, et al.)

A JFET is essentially a voltage amplifier consisting of a conducting channel between two nearly identical junctions, typically labelled drain and source. The direction of current flow through the channel depends on the DC potential between the drain and the source, provided the gate (controlling the channel) is properly biased. When used in a common gate configuration, the output current and input current of the JFET are the same. Voltage gain is achieved by providing a higher impedance at the drain than at the source. Typically, an impedance matching circuit is provided to match the high impedance at the drain to the load. The low impedance at the source of the JFET can either be connected directly to the input if the impedance match is satisfactory, or through a matching circuit, if required. Thus, the JFET must be provided with appropriate impedance matching circuitry to operate. Such circuitry operates to provide a specific impedance match and thus operates in only one direction.

One direction amplifiers using JFETs with appropriate impedance matching circuits are known in the art. (See, U.S. Pat. No., 4,163,198 to Berning, U.S. Pat. No. 4,214,215 to Mellen, et al., U.S. Pat. No. 4,591,803 to Saleh, U.S. Pat. No. 4,598,253 to Reindel, et al., U.S. Pat. No. 4,639,683 to Counts, et al. and U.S. Pat. No. 4,713,626 to Susak, et al.) It is not known, however, to provide versatile impedance matching circuits to be able to use a JFET in a bi-directional amplifier.

It is accordingly an object of the present invention to provide a novel bi-directional amplifier that obviates the problems of the prior art and uses a JFET to reduce the number of amplifiers required.

It is another object of the present invention to provide a novel bi-directional amplifier that uses the symmetrical properties of the JFET to make the designation of drain and source in the JFET dependent on the direction of signal flow through the amplifier.

It is yet another object of the present invention to provide a novel bi-directional amplifier with versatile impedance matching circuits at the two junctions of a JFET to make the JFET operable as an amplifier in both directions.

It is a further object of the present invention to provide a novel method for amplifying a signal in which a single JFET amplifies the signal as it flows in either direction through the JFET.

These and many other objects and advantages will be readily apparent to one skilled in the art to which the invention pertains from a perusal of the claims, the appended drawings, and the following detailed description of preferred embodiments.

DRAWINGS

DESCRIPTION OF PREFERRED EMBODIMENTS

Figure 1:
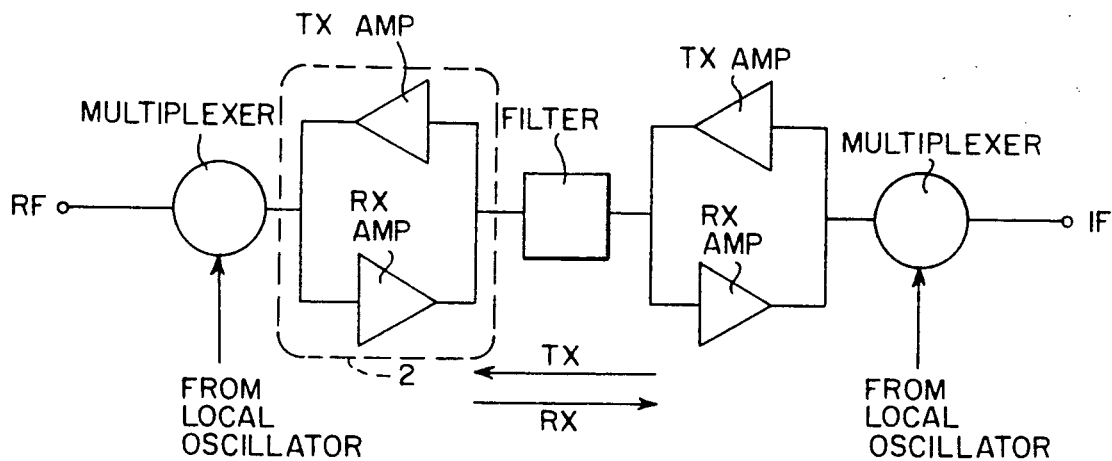
FIG. 1 is a block diagram of a portion of a transceiver known in the art, including an intermediate frequency amplifier section in which the present invention may be used.

With reference now to the figures where like elements have been like numerical designations to facilitate an understanding of the present invention, and particularly with reference to FIG. 1, the present invention may be used in a communication system to a pair of amplifiers. It may be used, for example, to replace transmit and receive amplifiers 2 in an intermediate frequency (IF) amplifier in a radio frequency (RF) transceiver (a portion of which is shown in FIG. 1). Typically, such transceivers operate bi-directionally. They translate received RF frequencies into an audio signal on an intermediate frequency, and translate an audio spectrum into RF frequencies for transmission. The procedure is essentially reversible, with the same frequency translation scheme being used in both directions. Passive elements in the transceiver, such as filters and multiplexers, operate in both directions, but active elements, such as amplifiers, have not generally been adapted for use in both directions. Accordingly, separate amplifiers are needed in the typical prior art circuit, one in the direction of transmission and the other in the direction of reception.

Figure 2:
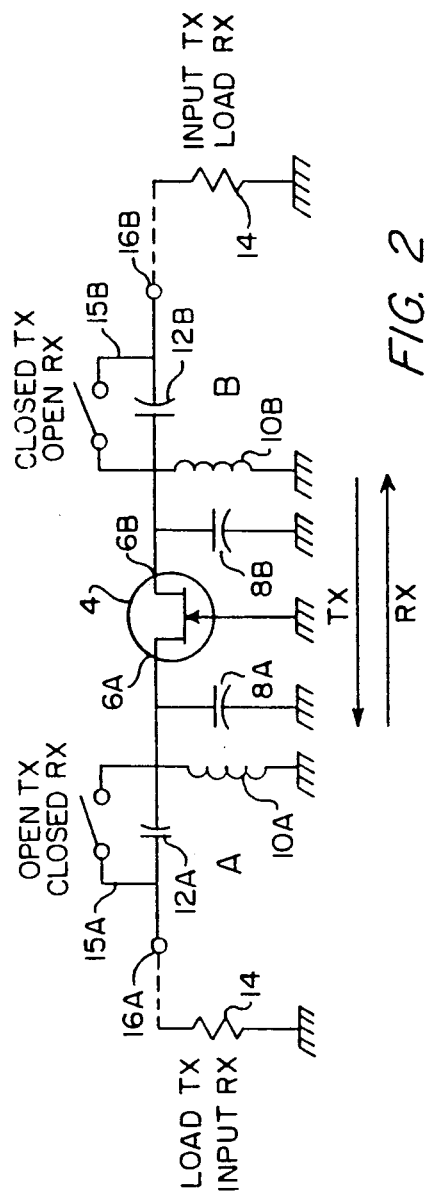
FIG. 2 is a schematic of an embodiment of the present invention.

With reference now to FIG. 2, the present invention may include a JFET 4 in a common gate configuration with symmetrical circuits A and B connected to the junctions 6A and 6B of the JFET for adjusting the impedance at the junctions. The JFET gate may be connected to ground. The circuits A and B alternatively couple the input (shown only by its resistance) directly to the junction set by the bias voltage to be a source with low impedance, and couple the load (shown only by its resistance) to the junction set by the bias voltage to be a drain with high impedance.

Figure 3:
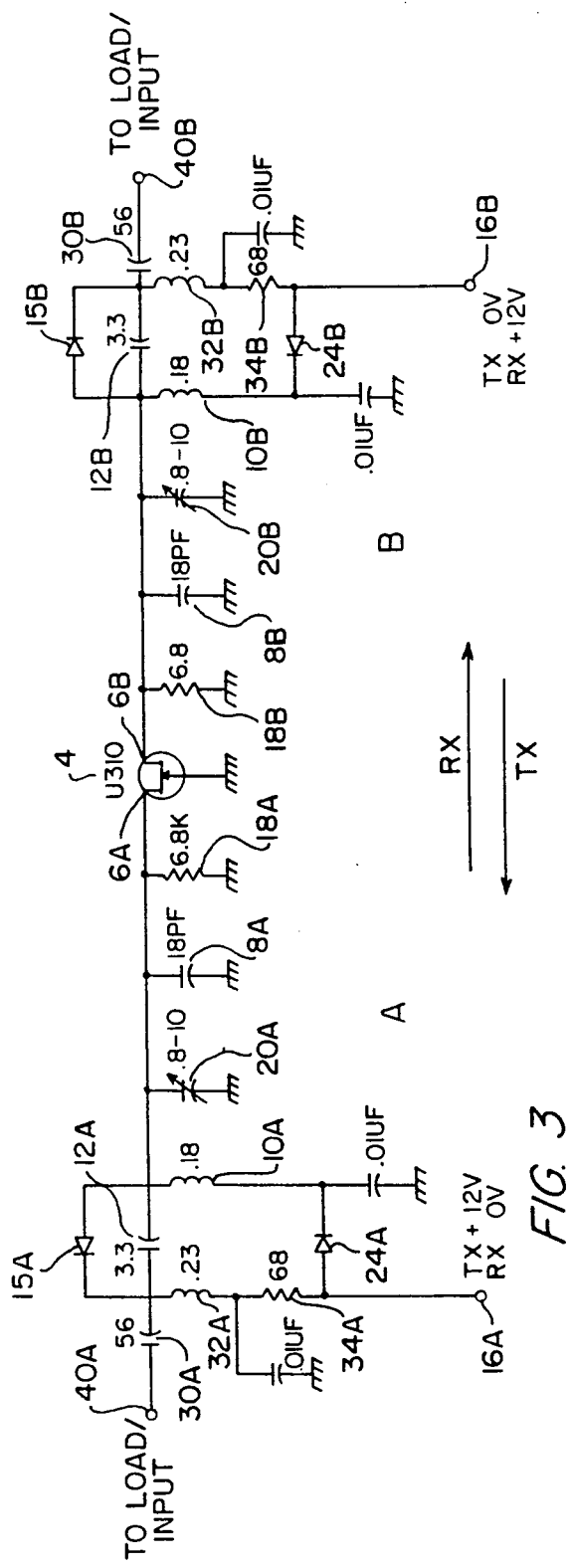
FIG. 3 is a schematic of another embodiment of the present invention as it might be used in an intermediate frequency amplifier section.

Each circuit A and B may include a capacitor 8 (similar circuit elements are designated as _A for circuit A and _B for circuit B in FIGS. 2 and 3) arranged in parallel with an inductor 10. A capacitor 12 may be arranged in series with the resistance 14 of the load/input. A switch 15 may be provided to selectably remove or insert series capacitor 12. DC biasing voltage may be provided at connection 16. Capacitor 8 and inductor 10 may be connected to ground.

In operation, when the device in which the present invention is operating is sending a signal from right to left in FIG. 2 (i.e., transmitting in this embodiment) a DC biasing voltage may be provided at connection 16A to set junction 6A as a drain and junction 6B as a source. Switch 15B is closed, removing series capacitor 12B from circuit B. The input is thereby connected directly to the low impedance source 6B. Since the source impedance is low, the Q of the input (such as a tank circuit) is decreased and impedance mismatch is negligible.

Meanwhile, in circuit A switch 15A is opened inserting series capacitor 12A into circuit A. Series capacitor 12A reflects across inductor 10A, the value of which may be modified from that typically used in an L-matching network to resonate with the parallel capacitor 8A and the series capacitor 12A. Parallel capacitor 8A dominates the reflected capacitance of the series capacitor 12A and the output capacitance of the circuit.

When the signal flow through the present invention is reversed (e.g., receiving), the circuits A and B perform opposite functions. Junction 6A becomes a source and 6B a drain.

With reference now to FIG. 3 another embodiment of the present invention may be used in an IF amplifier section in an RF transceiver. A JFET 4 may be supplied by symmetric circuits A and B connected to the junctions 6A and 6B of the JFET for adjusting the impedance at the junctions. The symmetric circuit A includes a resistor 18 electrically connected between the junction 6A and reference voltage. A fixed capacitor 8A and a variable capacitor 20A are also connected between the junction 6A and reference, i.e., parallel to the junction. A switched L-matching network comprising an inductor 10A in parallel to the fixed capacitor 8A and a switched series capacitor 12A is electrically connected to the switched and variable capacitors 8A and 20A. The switch may comprise a high speed PIN diode 15A. A low Q matching network, comprising a capacitor 30A and an inductor 32A may be connected between the switched L-matching network and the load or input. Ground reference or supply voltage is supplied to the circuit A by way of a resistor 34A and a switching diode 24A.

In operation, a U310 JFET has been found to be acceptable as JFET 4. This JFET has forward transconductance of 12 millimhos, which makes the input impedance of the JFET 4 equal to approximately 83 ohms in the common gate configuration of the circuit of FIG. 3. The resistor 18 provides a fixed drain impedance.

The L-matching network (inductor 10A and series capacitor 12A) may be designed in the conventional manner to select appropriate values of inductance and impedance. The parallel capacitor 8A may be selected to have a value approximately five times greater than the value of the series capacitor 12A. The value of the inductor 10A may then be adjusted to compensate for the presence of the fixed capacitors 12A and 8A so that the circuit resonates at the operating frequency of the signal. For the circuit of FIG. 3, the inductor 10A was selected to have a value which would provide resonance at 70.455 MHz. It has also been found that the output tank of the circuit of FIG. 3 has a high enough Q that tuning may become necessary and the variable capacitor 20A may be included in the circuit to permit tuning. With the variable capacitor 20A in place, the total parallel capacitance is derived from both the variable and fixed capacitors 20A and 8A.

In operation, the circuit of FIG. 3 may be operated with a reasonable return loss by driving the source signal directly into the JFET 4 (through the switch 15A). However, the circuit may be improved by providing a better match of input impedance to the source. Accordingly, the low Q impedance matching network (comprising the capacitor 30A and inductor 32A) may be added. In keeping with the symmetry of the circuit of FIG. 3, the low Q impedance matching network may be added to both ends of the circuit without affecting its bi-directional nature.

To operate the circuit of FIG. 3, the input terminal 40 is taken to DC ground through a resistor 34 and a DC supply voltage is supplied to the output terminal 40 through a switching diode 24 and the resonating inductor 10. Amplification results in the direction from the selected "input" to the "output". The switching diode 24 helps to reverse bias the PIN diode 15 when the PIN diode 15 is not required to be on and to block DC when its associated terminal is used as an input to the circuit. Representative characteristic values of the various elements in this embodiment of the present invention have been included in FIG. 3.

Figure 4:
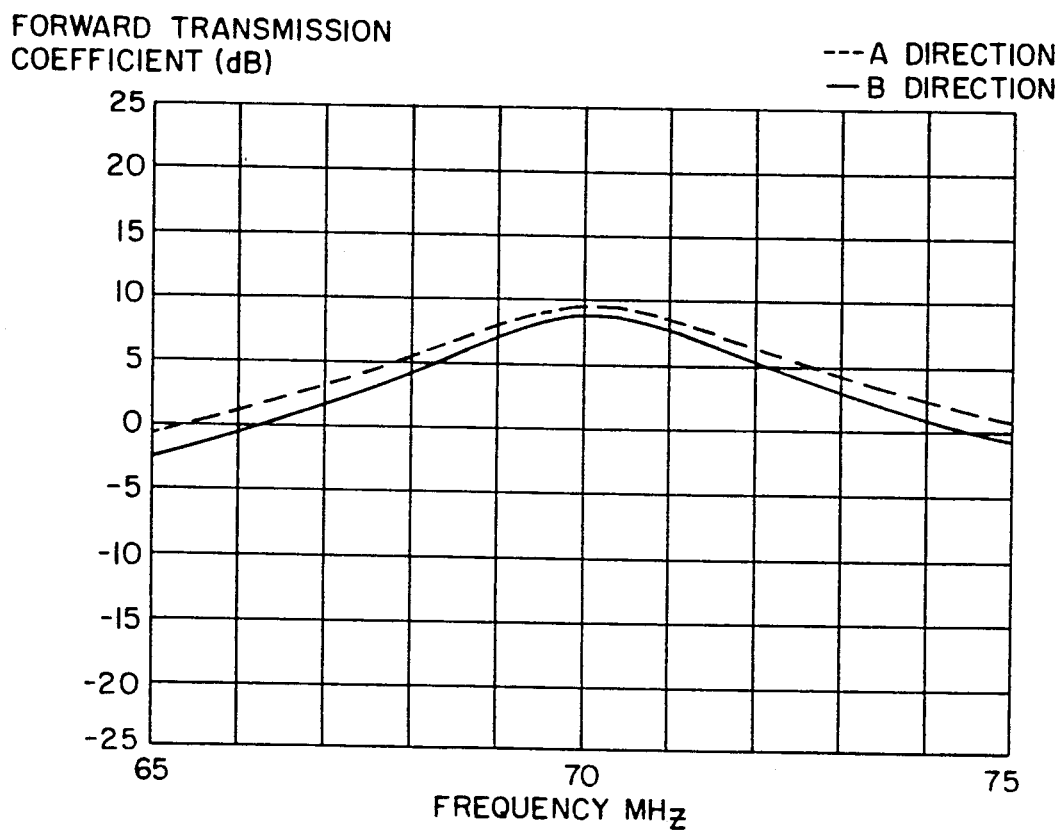
FIG. 4 is a plot of forward transmission coefficient in decibels versus frequency in MHz illustrating the substantial similarity of gain achieved in both directions by the present invention.

When the present invention is used in a IF amplifier, the gain in each direction (as measured by the forward transmission coefficient in decibels) is substantially the same in each direction. As seen in FIG. 4, a plot of measured forward transmission coefficient versus frequency in a circuit built in accordance with the present invention, this relationship holds even as the frequency varies from the center frequency.

When the embodiment of FIG. 3 is used in an IF amplifier in a transceiver, the transceiver may be tuned by adjusting the variable capacitor 20 in each output tank for best output return loss when that direction is selected. In addition, the two output tanks can be independently tuned for different frequencies. That is, the frequency of operation in one direction may be different from the frequency of operation in the other.

The ability to tune independently is attributable to the low amount of interaction between the two tanks. The interaction is naturally low in the present invention due to the lowered Q of the input tank and the small reverse transconductance of the JFET 4. Interaction may be further reduced by careful design of the circuit layout to minimize coupling between the tanks.

While preferred embodiments of the present invention have been described, it is to be understood that the embodiments described are illustrative only and that the scope of the invention is to be defined solely by the appended claims when accorded a full range of equivalence, many variations and modifications naturally occurring to those skilled in the art from a perusal hereof.

We claim:

1. A bi-directional amplifier system for a radio-frequency transceiver in which radio frequency signals propagate in a first direction through the amplifier when the transceiver is transmitting and propagate in the opposite direction when the transceiver is receiving, comprising:

(a) a channel-type amplifying device having a grounded gate and two junctions for amplifying a voltage related to a signal received at one of the junctions;

(b) two impedance circuits, one electrically connected to each of the junctions, for providing a relatively low impedance at a selected one of said junctions and for providing a relatively high impedance at the other of said junctions, each of said impedance circuits comprising,
  (1) resistance means connected electrically in parallel between one of said junctions and a ground reference,
  (2) parallel capacitance means connected electrically in parallel to said resistance means,
  (3) an L-matching network circuit electrically connected to said one of said junctions, said L-matching network circuit comprising,
    an inductor electrically in parallel to said resistance means, a series capacitor electrically in series between said one of said junctions and a terminal of the amplifier system, and a switch connected to shunt said series capacitor,
  (4) a low Q impedance matching network circuit electrically connected in series between said L-matching network and said terminal, said low Q impedance matching network circuit comprising, an inductor electrically connected in parallel to said resistance means, a capacitor electrically connected in series between said L-matching network and said terminal, and
  (5) a switched supply of power electrically connected to supply said power to one of said junctions, and
(c) logic means to selectively operate one of the impedance circuits to provide a relatively low impedance at the terminal transmitting the signal to be transmitted.

2. The amplifier system of claim 1 wherein said logic means includes means to selectively shunt said series capacitor in one of said two impedance circuits and to selectively supply said power in the other of said two impedance circuits.

3. The amplifier system of claim 1 wherein the inductance of said inductor in said L-matching network circuit is selected to provide resonance at the frequency of the signal being transmitted in a circuit comprising said inductor, said series capacitor and said parallel capacitance means.

4. The amplifier system of claim 3 wherein said parallel capacitance means comprises plural capacitors, at least one of which is a variable capacitor.

5. A bi-directional amplifier for an RF transceiver with a signal flowing in one direction through said amplifier when said transceiver is transmitting and in the opposite direction when said transceiver is receiving, comprising:
  a JFET having a gate and two junctions for amplifying a voltage related to the signal received at either of said junctions; and
  two circuits, one connected to each of said two junctions, for providing a relatively low impedance at a selected one of said junctions receiving the signal and for providing a relatively high impedance at the other of said junctions, each of said circuits comprising,
    first capacitor means and inductor means electrically in parallel to each other and to one of said junctions,
    second capacitor means in series between said one of said junctions and a terminal of said amplifier, and
    switching means responsive to the direction of the signal for shunting said second capacitor means from the one of said circuits providing a low impedance.

6. A bi-directional amplifier comprising:
  a JFET having a gate and two junctions for amplifying a voltage related to a signal alternatively received at each of said two junctions; and
  means for varying the impedance at each of said two junctions, the means comprising first capacitor means and parallel inductor means connected to said junctions, the impedance being relatively low at the one of said two junctions receiving the signal and the impedance being relatively high at the other of said two junctions,
  so that said amplifier is able to operate bi-directionally.

7. The amplifier as defined in claim 6 wherein said means for varying the impedance further comprises second capacitor means in series connection between a load and said JFET, and switching means for inserting and removing said second capacitor means responsive to the direction of signal flow through said amplifier.

8. A bi-directional amplifier comprising:
  a JFET having a gate and two junctions, wherein either one of said two junctions may be a drain, said drain being determined by a bias voltage applied thereto in response to the direction of amplification; and
  circuit means connected to said two junctions for maintaining a relatively high impedance at said drain and for providing a relatively low impedance at the other said junction, said circuit means comprising means for varying the capacitance of said circuit means responsive to the direction of amplification
  so that said amplifier is able to operate bi-directionally.

9. A device for alternatively amplifying two signals having different frequencies flowing in opposite directions through said device comprising:
  two tanks, each for providing one of said two signals, each of said two tanks having tuning means for tuning its frequency; and
  a bi-directional amplifier connected between said two tanks for ampliyifng said signals,
  said bi-directional amplifier having a JFET, and means for varying the impedance at each of said JFET's two junctions,
  whereby each of said tanks may be tuned independently of the other and whereby said bi-directional amplifier amplifies signals having one frequency in one direction and signals having another frequency in the other direction.

10. A method of amplifying a signal flowing in one direction through a transceiver when the transceiver is transmitting and in the opposite direction when the transceiver is receiving comprising the steps of:
  (a) applying a biasing voltage to a JFET so that current flows in one direction between the two junctions of said JFET when the transceiver is transmitting and in the opposite direction when the transceiver is receiving; and
  (b) varying the impedance at said two junctions so that the impedance is relatively low at the one of said junctions from which the current is flowing and relatively high at the other said junction.

11. A method for amplifying a signal flowing in either direction through a transceiver comprising the steps of:
  (a) providing a JFET;
  (b) varying the capacitance at the two junctions of said JFET responsive to the signal direction by inserting or removing capacitor means in series with loads connected to said junctions; and
  (c) varying the direction of current flow between said junctions responsive to the signal direction by applying a biasing voltage to the one of said junctions to which the current is flowing.

12. A bi-directional amplifier comprising:
  a JFET with two junctions; and
  circuit means connected to said two junctions for varying the capacitance at said two junctions responsive to the direction of amplification of said amplifier, said circuit means comprising a capacitor and switching means for inserting and removing said capacitor responsive to the direction of amplification.

13. The amplifier as defined in claim 12 wherein either one of said two junctions may be a drain, said drain being determined by a bias voltage applied thereto in response to the direction of amplification.

14. The amplifier as defined in claim 12 wherein said circuit means comprises first capacitor means and parallel inductor means connected to said junctions.

15. The amplifier as defined in claim 14 wherein said circuit means further comprises second capacitor means in series connection between a load and said JFET, and switching means for inserting and removing said second capacitor means responsive to the direction of amplification.

* * * * *